(12) United States Patent
Flachowsky et al.

(10) Patent No.: US 9,093,554 B2
(45) Date of Patent: Jul. 28, 2015

(54) METHODS OF FORMING SEMICONDUCTOR DEVICES WITH EMBEDDED SEMICONDUCTOR MATERIAL AS SOURCE/DRAIN REGIONS USING A REDUCED NUMBER OF SPACERS

(75) Inventors: Stefan Flachowsky, Dresden (DE); Ricardo P. Mikalo, Heideblick (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 87 days.

(21) Appl. No.: 13/470,454

(22) Filed: May 14, 2012

(65) Prior Publication Data
US 2013/0302956 A1    Nov. 14, 2013

(51) Int. Cl.
| H01L 21/00 | (2006.01) |
|---|---|
| H01L 21/8238 | (2006.01) |
| H01L 21/265 | (2006.01) |
| H01L 29/66 | (2006.01) |
| H01L 29/78 | (2006.01) |

(52) U.S. Cl.
CPC .. *H01L 21/823807* (2013.01); *H01L 21/26513* (2013.01); *H01L 21/823814* (2013.01); *H01L 21/823864* (2013.01); *H01L 29/665* (2013.01); *H01L 29/6653* (2013.01); *H01L 29/6656* (2013.01); *H01L 29/66636* (2013.01); *H01L 29/7834* (2013.01)

(58) Field of Classification Search
CPC ............... H01L 21/823807; H01L 21/823814; H01L 21/823864; H01L 21/26513; H01L 29/7834; H01L 29/6653; H01L 29/6656; H01L 29/66636; H01L 29/665

USPC ......... 438/197, 199, 226, 229, 230, 231, 232, 438/299, 300, 302, 478, 488, FOR. 217
See application file for complete search history.

(56) References Cited

U.S. PATENT DOCUMENTS

| 6,124,627 | A | * | 9/2000 | Rodder et al. | 257/616 |
|---|---|---|---|---|---|
| 6,146,934 | A | * | 11/2000 | Gardner et al. | 438/230 |
| 6,174,778 | B1 | * | 1/2001 | Chen et al. | 438/302 |
| 6,465,853 | B1 | * | 10/2002 | Hobbs et al. | 257/410 |
| 6,583,016 | B1 | * | 6/2003 | Wei et al. | 438/303 |

(Continued)

OTHER PUBLICATIONS

Office Action dated Dec. 2, 2014 from the Intellectual Property Office of Taiwan for counterpart Taiwanese patent application No. 102103665, 23 pages.

*Primary Examiner* — Victor A Mandala
*Assistant Examiner* — Quovaunda V Jefferson
(74) *Attorney, Agent, or Firm* — Amerson Law Firm, PLLC

(57) ABSTRACT

In one example, a method disclosed herein includes the steps of forming a gate structure for a first transistor and a second transistor above a semiconducting substrate, forming a liner layer above the gate structures and performing a plurality of extension ion implant processes through the liner layer to form extension implant regions in the substrate for the first transistor and the second transistor. The method further includes forming a first sidewall spacer proximate the gate structure for the first transistor and a patterned hard mask layer positioned above the second transistor, performing at least one etching process to remove the first sidewall spacer, the patterned hard mask layer and the liner layer, forming a second sidewall spacer proximate both of the gate structures and performing a plurality of source/drain ion implant processes to form deep source/drain implant regions in the substrate for the first transistor and the second transistor.

21 Claims, 9 Drawing Sheets

(56) References Cited

U.S. PATENT DOCUMENTS

| | | | |
|---|---|---|---|
| 2005/0112817 A1* | 5/2005 | Cheng et al. | 438/219 |
| 2007/0123010 A1* | 5/2007 | Hoentschel et al. | 438/486 |
| 2008/0003783 A1* | 1/2008 | Wei et al. | 438/478 |
| 2009/0218633 A1* | 9/2009 | Hoentschel et al. | 257/369 |

* cited by examiner

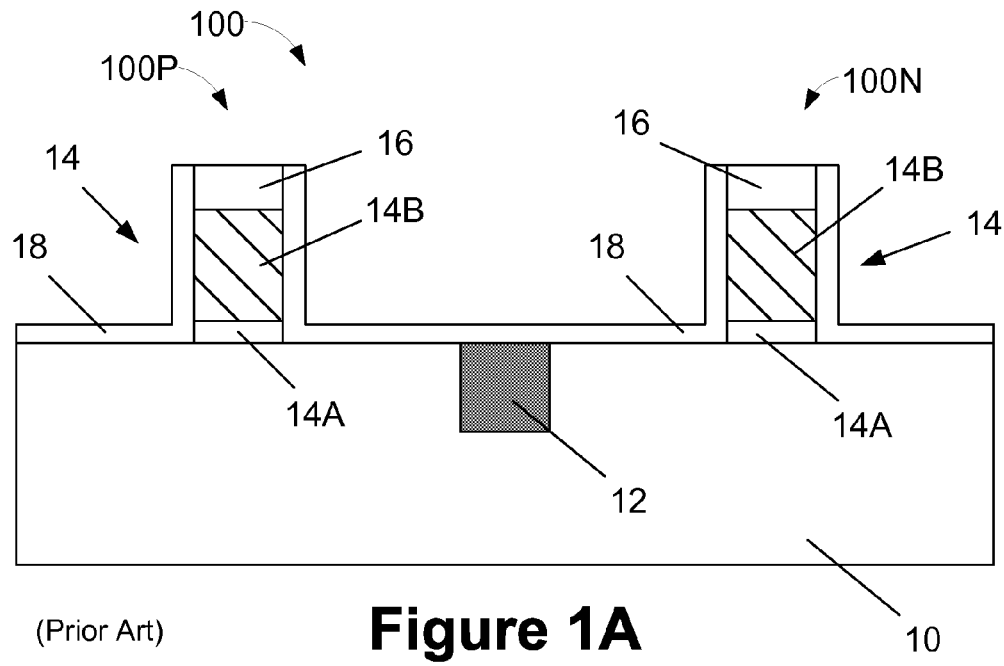
(Prior Art) Figure 1A
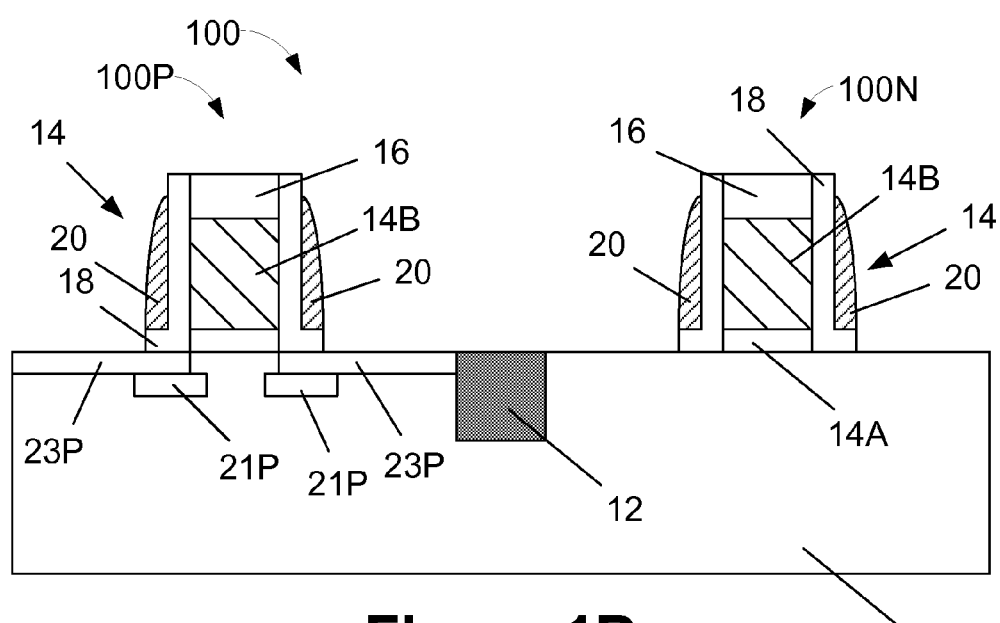
(Prior Art) Figure 1B

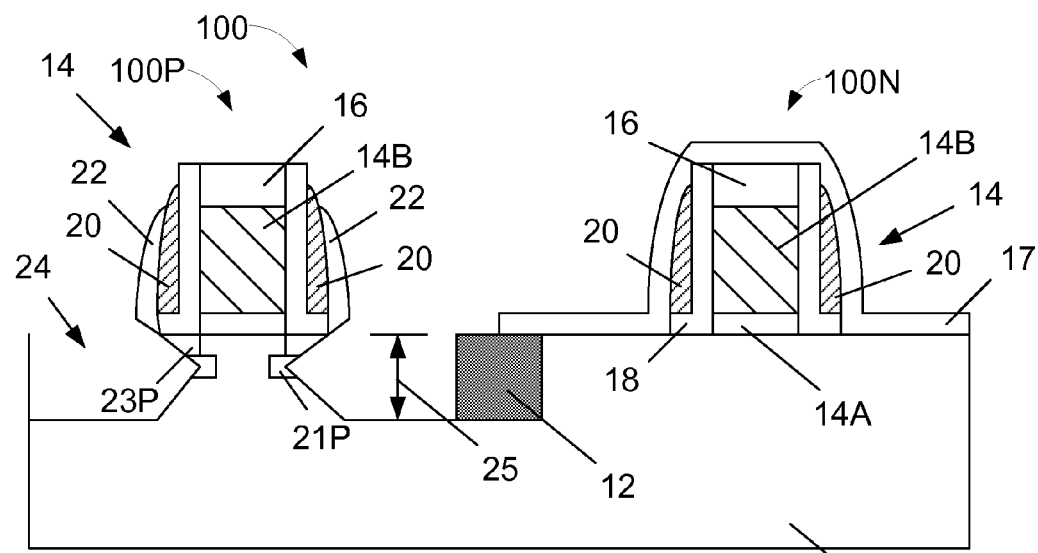
(Prior Art) Figure 1C
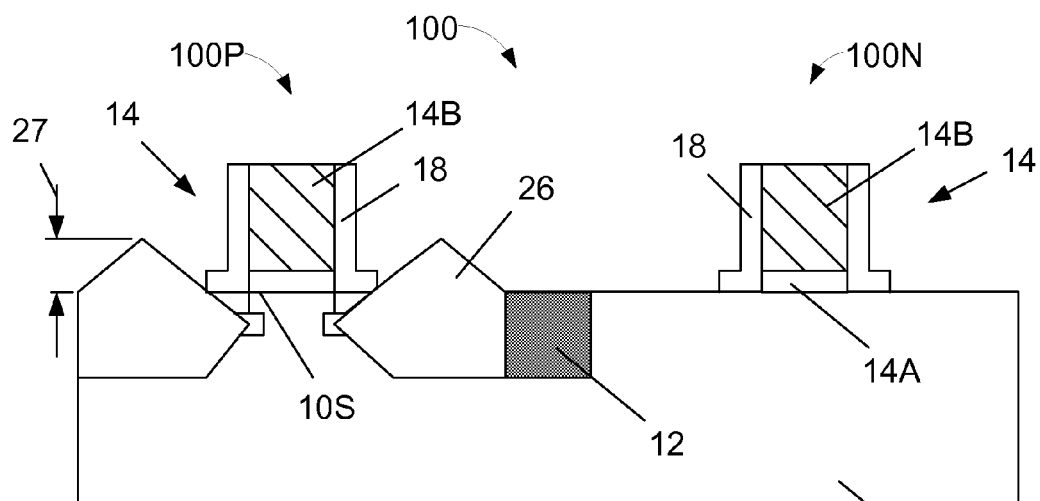
(Prior Art) Figure 1D

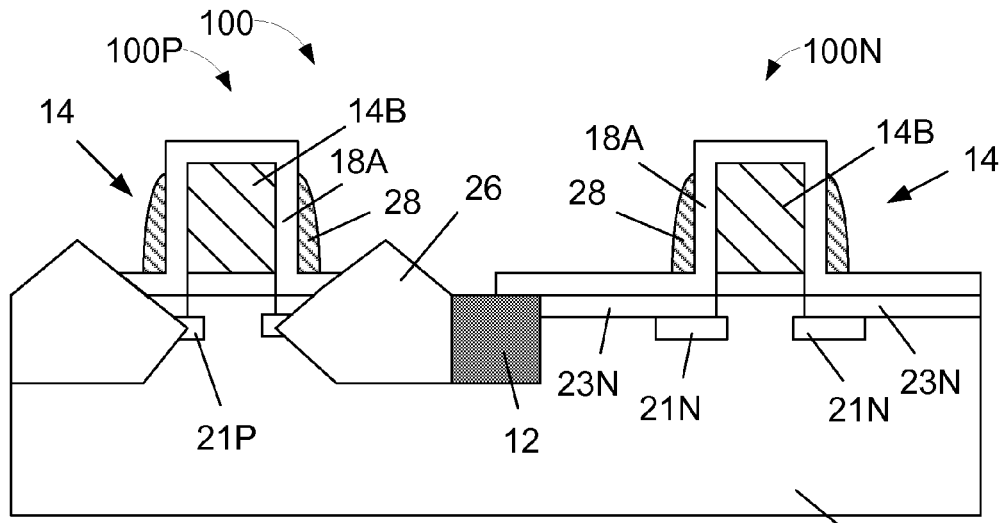
(Prior Art) Figure 1E
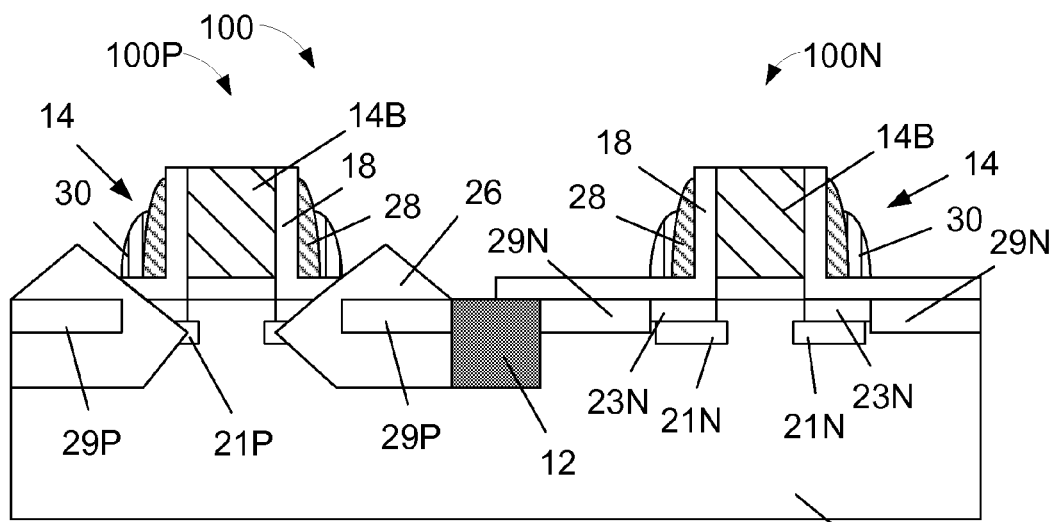
(Prior Art) Figure 1F

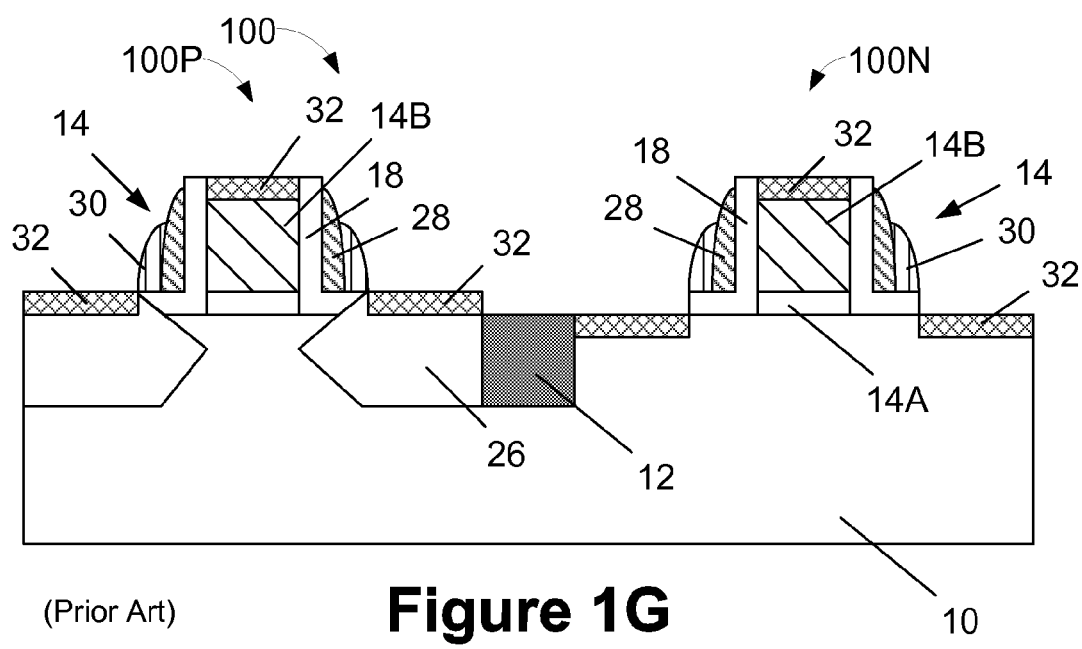
(Prior Art) Figure 1G

METHODS OF FORMING SEMICONDUCTOR DEVICES WITH EMBEDDED SEMICONDUCTOR MATERIAL AS SOURCE/DRAIN REGIONS USING A REDUCED NUMBER OF SPACERS

BACKGROUND OF THE INVENTION

1. Field of the Invention

Generally, the present disclosure relates to the manufacture of sophisticated semiconductor devices, and, more specifically, to various methods of forming semiconductor devices using a novel process flow that involves a reduced number of spacers.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Metal oxide field effect transistors (MOSFETs or FETs) represent one important type of circuit element that substantially determines performance of the integrated circuits. A FET (whether an NFET or a PFET) is a device that typically includes a source region, a drain region, a channel region that is positioned between the source region and the drain region, and a gate electrode positioned above the channel region. A gate insulation layer is positioned between the gate electrode and the channel region that will be formed in the substrate. Electrical contacts are made to the source and drain regions, and current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region. Traditionally, FETs have been substantially planar devices, but similar principles of operation apply to more three-dimensional FET structures, devices that are typically referred to as FinFETs.

The formation of transistors typically involves performing one or more ion implantation processes to form various doped regions in the substrate, such as halo implant regions, extension implant regions and deep source/drain implant regions. In many of the cases, one or more spacers are formed adjacent a gate electrode structure so as to control the location of the various implant regions. Typically, these spacers are made of silicon nitride to facilitate processing. More specifically, silicon nitride is often selected because it can be readily etched, and thus removed, relative to a silicon substrate and an underlying silicon dioxide liner layer which is frequently present to act as an etch stop layer when the silicon nitride spacer is removed.

FIGS. 1A-1G depict one illustrative prior art process flow for forming a semiconductor device 100 that includes an illustrative PFET transistor 100P and an illustrative NFET transistor 100N using an illustrative combination of silicon nitride spacers. As shown in FIG. 1A, the process begins with the formation of illustrative gate structures 14 for the PFET transistor 100P and the NFET transistor 100N in and above regions of the substrate 10 that are separated by an illustrative shallow trench isolation structure 12. The gate structures 14 generally include a gate insulation layer 14A and one or more conductive gate electrode layers 14B. A gate cap layer 16, made of a material such as silicon nitride, is formed above the gate structures 14. Also depicted in FIG. 1A is an illustrative liner layer 18, made of a material such as silicon dioxide having a thickness of approximately 3-5 nm, that is conformally deposited on the device 100. The gate structures 14 depicted herein are intended to be schematic and representative in nature, as the materials of construction used in the gate structures 14 may be different for the PFET transistor 100P as compared to the NFET transistor 100N, e.g., the PFET transistor 100P may have multiple layers of conductive metal, etc. The gate insulation layer 14A may be comprised of a variety of materials, such as silicon dioxide, silicon oxynitride, a high-k (k value greater than 10) insulating material. The gate electrode layer 14B may be comprised of one or more layers of conductive materials, such as polysilicon, a metal, etc. The structure depicted in FIG. 1A may be formed by performing a variety of known techniques. For example, the layers of material that make up the gate insulation layer 14A, the gate electrode layer 14B and the gate cap layer 16 may be blanket-deposited above the substrate 10 and, thereafter, one or more etching process are performed through a patterned mask layer (not shown) to define the basic structures depicted in FIG. 1A. Thereafter, a conformal deposition process is performed to form the liner layer 18.

FIG. 1B depicts the device 100 after several process operations have been performed. More specifically, illustrative first sidewall spacers 20 (e.g., silicon nitride) with an illustrative base width of about 5-10 nm are formed adjacent the liner layer 18 for both the PFET transistor 100P and the NFET transistor 100N. The first spacers 20 may be formed by depositing a layer of spacer material and thereafter performing an anisotropic etching process. Exposed horizontal portions of the oxide liner layer 18 are removed after the spacers 20 are formed. Next, a masking layer (not shown), such as a photo-resist mask, is formed so as to cover the NFET transistor 100N and expose the PFET transistor 100P for further processing. Then, one or more ion implantation processes are performed on the exposed PFET transistor 100P to form various doped regions in the substrate 10. More specifically, at the point depicted in FIG. 1B, an angled ion implant process may be performed using an N-type dopant material to form so-called halo implant regions 21P in the substrate 10 for the PFET transistor 100P, and another vertical ion implantation process may be performed using a P-type dopant material to form extension implant regions 23P for the PFET transistor 100P. Thereafter, a very quick anneal process, such as a laser anneal process, may be performed at a temperature of about 1250° C. for about 10 milliseconds or so to repair the damaged lattice structure of the substrate 10 in the areas that were subjected to the ion implantation processes discussed above. The implant regions 21P, 23P are depicted schematically and they are located in a position where they will be after the anneal process has been performed, where some migration of the implanted dopant material may have occurred.

FIG. 1C also depicts the device 100 after several process operations have been performed on the device 100. More specifically, a hard mask layer 17, made of a material such as silicon nitride, is formed above the NFET transistor 100N and the PFET transistor 100P. The hard mask layer 17 may be formed by blanket-depositing the hard mask layer 17 across the device 100 and, thereafter, forming a masking layer (not shown), such as a photo-resist mask, so as to cover the NFET transistor 100N and expose the PFET transistor 100P for further processing. Then, an anisotropic etching process is performed to remove the hard mask layer 17 from above the PFET transistor 100P. This process results in the formation of a second sidewall spacer 22 adjacent the first sidewall spacer 20 on the PFET transistor 100P. In some embodiments, the second spacer 22 may have a base width of about 4-8 nm.

Next, one or more etching processes are performed to define cavities 24 in areas of the substrate 10 where source/drain regions for the PFET transistor 100P will ultimately be formed. The depth and shape of the cavities 24 may vary depending upon the particular application. In one example, where the cavities 24 have an overall depth 25 of about 70 nm, the cavities 24 may be formed by performing an initial dry anisotropic etching process to a depth of about 40-50 nm and, thereafter, performing a wet etching process using, for example TMAH, which has an etch rate that varies based upon the crystalline structure of the substrate 10, e.g., the etching process using TMAH exhibits a higher etch rate in the 110 direction than it does in the 100 direction.

FIG. 1D depicts the device 100 after an epitaxial deposition process is performed to form epitaxial silicon/germanium regions 26 in the cavities 24 (FIG. 1C). In the depicted example, the regions 26 have an overfill portion that extends above the surface 10S of the substrate 10. In the depicted example, the uppermost surface of the epitaxial silicon/germanium regions 26 extends above the substrate 10 by a distance 27 of about 25 nm. The regions 26 may be formed by performing well-known epitaxial deposition processes. The device 100 in FIG. 1D has also been subjected to an etching process using, for example, hot phosphoric acid, to remove all of the exposed nitride materials, such as the hard mask layer 17, the first spacers 20, the second spacers 22 and the gate cap layers 16.

As shown in FIG. 1E, any remaining portions of the original liner layer 18 may be removed and new liner layer 18A comprised of, for example, 3-5 nm of silicon dioxide, may be formed in its place. Alternatively, the original liner layer 18 may remain in place. Thereafter, illustrative third sidewall spacers 28 (e.g., silicon nitride) with an illustrative base width of about 5-10 nm are formed adjacent the liner layer 18A for both the PFET transistor 100P and the NFET transistor 100N. The third sidewall spacers 28 may be formed by depositing a layer of spacer material and thereafter performing an anisotropic etching process. Next, a masking layer (not shown), such as a photoresist mask, is formed so as to cover the PFET transistor 100P and expose the NFET transistor 100N for further processing. Then, one or more ion implantation processes are performed on the exposed NFET transistor 100N to form various doped regions in the substrate 10. More specifically, at the point depicted in FIG. 1E, an angled ion implantation process may be performed using a P-type dopant material to form so-called halo implant regions 21N in the substrate 10 for the NFET transistor 100N, and another vertical ion implantation process may be performed using an N-type dopant material to form extension implant regions 23N for the NFET transistor 100N. Thereafter, a very quick anneal process, such as a laser anneal process, may be performed at a temperature of about 1250° C. for about 10 milliseconds or so to repair the damaged lattice structure of the substrate 10 in the areas that were subjected to the ion implantation processes discussed above. The implant regions 21N, 23N are depicted schematically and they are located in a position where they will be after the anneal process has been performed, wherein some migration of the implanted dopant material may have occurred.

Next, as shown in FIG. 1F, a set of fourth sidewall spacers 30 (e.g., silicon nitride) are formed for both the PFET transistor 100P and the NFET transistor 100N. Although not depicted in the drawings, another conformal liner layer of, for example, 3-5 nm of silicon dioxide may be formed so as to cover the third sidewall spacers 28 prior to forming the fourth sidewall spacers 30. Thereafter, deep source/drain ion implantation processes are performed on the PFET transistor 100P and the NFET transistor 100N using appropriate masking layers and appropriate dopant materials, all of which are well known to those skilled in the art, to form P-doped source/drain implant regions 29P on the PFET transistor 100P and N-doped source/drain implant regions 29N on the NFET transistor 100N. One or more anneal processes are then performed to repair lattice damage to the substrate and to activate the implanted dopant material.

FIG. 1G depicts the device 100 after metal silicide regions 32 have been formed on the device 100. More specifically, the metal silicide regions 32 are formed on the gate electrode 14B and on the source/drain regions of the transistors 100P, 100N. So as not to obscure the drawings, the various doped regions described previously are not depicted in FIG. 1G. The metal silicide regions 32 may be made of any metal silicide and they may be formed using traditional silicidation techniques. The metal silicide regions 32 need not be the same metal silicide material on both the PFET transistor 100P and the NFET transistor 100N, although that may be the case. Although not depicted in the drawings, the fabrication of the device 100 would include several additional steps, such as the formation of a plurality of conductive contacts or plugs in a layer of insulating material so as to establish electrical connection with the source/drain regions of the transistors.

The above disclosed technique provides for the formation of four spacers at various points in the process flow. The formation of so many spacers during the above-described process flow provides a mechanism whereby the location of various doped regions may be positioned so as to individually enhance the performance capabilities of the PFET transistor 100P and the NFET transistor 100N. However, the formation of so many spacers does have a downside. More specifically, during the formation of the various spacers, the exposed substrate, i.e., the areas of the substrate where the source/drain regions are to be formed, are also attacked, which leads to undesirable localized recessing of the substrate in those areas. Moreover, the formation of such spacers involves performing multiple process operations for each spacer, i.e., at least the steps that involve the deposition of the spacer material and the subsequent anisotropic etching process that is performed to define each spacer. In some cases, like the one discussed above, the formation of multiple spacers during a particular process flow may also necessitate that an etching process be performed at some point in the process flow to remove one or more of the sidewall spacers. In summary, the process flow described above, wherein four sidewall spacers are formed, involves performing several process operations at great time and expense to the manufacturer, and the performance of so many process steps can lead to additional processing complexity and to damage to other aspects of the transistor device.

The present disclosure is directed to various methods of forming semiconductor devices using a novel process flow that involves a reduced number of spacers that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices using a novel process flow that involves a reduced number of spacers. In one example, a method disclosed herein includes the steps of forming a gate structure for a first transistor and a gate structure for a second transistor above a semiconducting substrate, forming a liner layer above the gate structures for the first and second transistors and performing a plurality of extension ion implant processes through the liner layer to form extension implant regions in the substrate for the first transistor and the second transistor. The method further includes forming a first sidewall spacer proximate the gate structure for the first transistor and a patterned hard mask layer positioned above the second transistor, performing at least one etching process to remove at least the first sidewall spacer, the patterned hard mask layer and the liner layer, forming a second sidewall spacer proximate both of the gate structures and performing a plurality of source/drain ion implant processes to form deep source/drain implant regions in the substrate for the first transistor and the second transistor.

In another illustrative example, a method disclosed herein includes forming a gate structure for a PFET transistor and a gate structure for an NFET transistor, forming a liner layer above the gate structures, performing a plurality of extension ion implant processes through the liner layer to form extension implant regions in the substrate for the PFET and NFET transistors and forming a first sidewall spacer proximate the gate structure for the PFET transistor and a patterned hard mask layer positioned above the NFET transistor. In this embodiment, the method also includes performing an epitaxial deposition process to form a silicon/germanium material or a silicon/carbon material proximate the gate structure of the PFET transistor, after performing the epitaxial deposition process, performing at least one etching process to remove at least the first sidewall spacer, the patterned hard mask layer and the liner layer, forming a second sidewall spacer proximate both of the gate structures of the PFET transistor and NFET transistor, wherein the second sidewall spacer has a base width that is greater than a base width of the first sidewall spacer, and, with the second sidewall spacers in position, performing a plurality of source/drain ion implant processes to form deep source/drain implant regions in the substrate for both of the PFET and NFET transistors.

BRIEF DESCRIPTION OF THE DRAWINGS

The disclosure may be understood by reference to the following description taken in conjunction with the accompanying drawings, in which like reference numerals identify like elements, and in which:

FIGS. 1A-1G depict one illustrative prior art process flow for forming a semiconductor device.

Figure 2A:
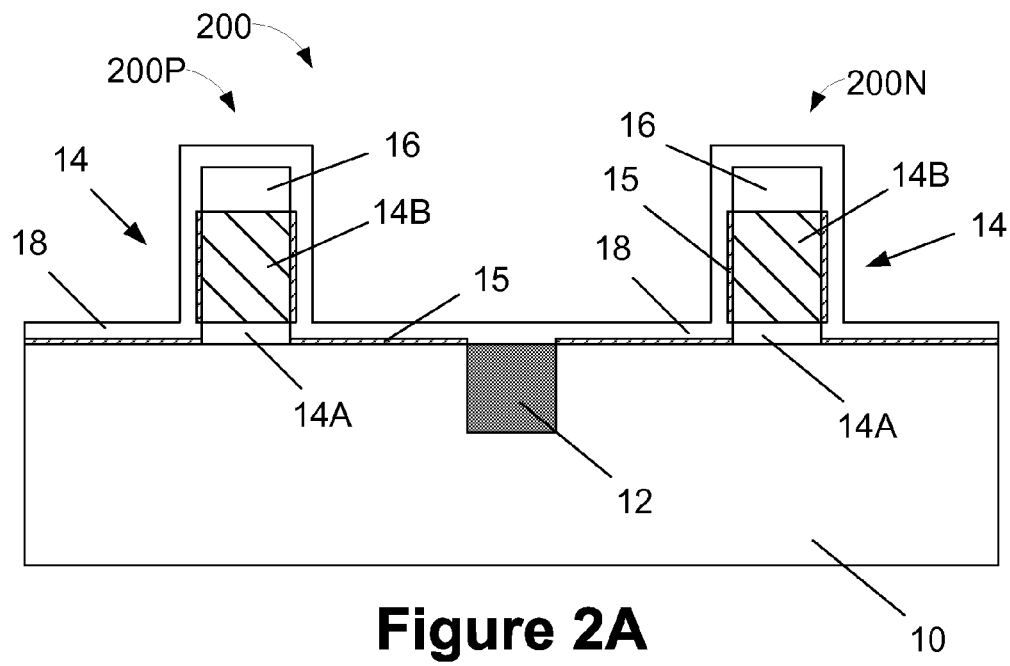
FIGS. 2A-2I depict various illustrative examples of using the methods disclosed herein to form semiconductor devices using a novel process flow that involves a reduced number of spacers.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming semiconductor devices using a novel process flow that involves a reduced number of spacers as compared to the prior art process flow described above in connection with FIGS. 1A-1G. Such a novel process flow may tend to reduce manufacturing costs and processing complexity and may tend to at least reduce some of the problems associated with the illustrative prior art process flow described previously. As will be readily apparent to those skilled in the art upon a complete reading of the present application, the present method is applicable to a variety of technologies, e.g., MOS-based technologies, etc., and is readily applicable to a variety of devices, including, but not limited to, logic devices, memory devices, etc. With reference to FIGS. 2A-2I, various illustrative embodiments of the methods and devices disclosed herein will now be described in more detail. To the extent that like numbers of various components are used in FIGS. 2A-2I and FIGS. 1A-1G, the previous discussion of those components in connection with the device 100 applies equally as well to the device 200.

FIG. 2A is a simplified view of an illustrative semiconductor device 200 at an early stage of manufacture. The semiconductor device 200 includes an illustrative PFET transistor 200P and an illustrative NFET transistor 200N. As shown in FIG. 2A, the process begins with the formation of illustrative gate structures 14 for the PFET transistor 200P and the NFET transistor 200N in and above active regions of the substrate 10 that are separated by an illustrative shallow trench isolation structure 12. The gate structures 14 generally include a gate insulation layer 14A and one or more conductive gate electrode layers 14B. A gate cap layer 16, made of a material such as silicon nitride, is formed above the layers of material that comprise the gate structures 14 prior to gate patterning operations. Also depicted in FIG. 2A is an optional re-oxidation layer 15, e.g., silicon dioxide, that may be formed on the exposed silicon surfaces after gate patterning operations are completed. The re-oxidation layer 15 may not be required in all applications, thus it is not depicted in any of the following drawings. Also depicted in FIG. 2A is an illustrative liner layer 18, made of a material such as silicon dioxide having a thickness of approximately 3-5 nm, that is conformably deposited on the device 200 by performing, for example, a CVD or ALD process. The gate structures 14 depicted in FIG. 2A are intended to be schematic and representative in nature, as the materials of construction used in the gate structures 14 may be different for the PFET transistor 200P as compared to the NFET transistor 200N. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

As will be recognized by those skilled in the art after a complete reading of the present application, the gate structures 14 may be of any desired construction and comprised of any of a variety of different materials, such as one or more conductive layers made of polysilicon or a metal, etc., and one or more layers of insulating material, such as silicon dioxide, a high-k material, etc. Additionally, the gate structure 14 for the NFET transistor 200N may have different material combinations as compared to a gate structure 14 for the PFET transistor 200P. Thus, the particular details of construction of the gate structures 14, and the manner in which the gate structures 14 are formed, should not be considered a limitation of the present invention. For example, the gate structures 14 may be made using so-called "gate-first" or "gate-last" techniques.

Figure 2B:
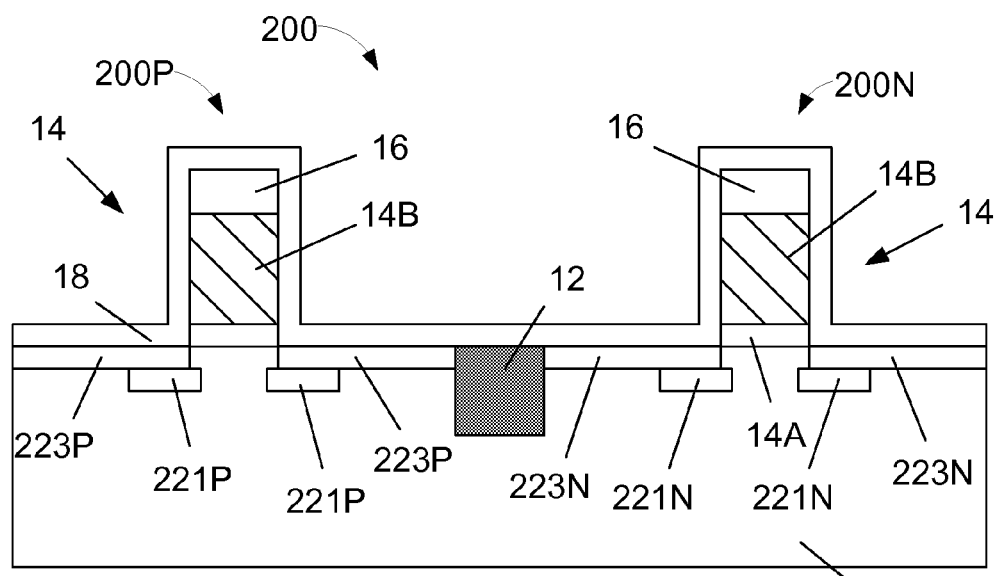

Next, as shown in FIG. 2B, using appropriate masking layers, various implantation processes are performed through the liner layer 18 to form halo implant regions (221P, 221N) and extension implant regions (223P, 223N) in both the PFET transistor 200P and the NFET transistor 200N. Since the implant processes discussed below will be performed through the liner layer 18, the implant dose and/or implant energy of the various ion implant processes that are typically performed on exposed portions of the substrate may be increased by about 20% or so. For example, a typical extension implant process may be performed on an exposed substrate using a dopant dose of about $1e^{13}$ ions/cm$^2$ at an energy level of about 3 keV, while an extension implant process that is performed through the liner layer 18 may be performed at a dopant dose of about $1e^{15}$ ions/cm$^2$ at an energy level of about 4-5 keV. The implant regions may be formed in any order, i.e., the implant regions may be formed first on either of the PFET transistor 200P or the NFET transistor 200N.

In one illustrative process flow, a masking layer (not shown), such as a photoresist mask, is formed so as to cover the NFET transistor 200N and expose the PFET transistor 200P such that various doped regions for the PFET transistor 200P may be formed in the substrate 10. More specifically, at the point depicted in FIG. 2B, an angled halo ion implant process has been performed using an N-type dopant material to form the schematically depicted halo implant regions 221P for the PFET transistor 200P, and another vertical extension ion implant process has been performed using a P-type dopant material to form extension implant regions 223P for the PFET transistor 200P.

With continuing reference to FIG. 2B, the masking layer (not shown) above the NFET transistor 200N is removed and a masking layer (not shown), such as a photoresist mask, is formed so as to cover the PFET transistor 200P and expose the NFET transistor 200N such that various doped regions for the NFET transistor 200N may be formed in the substrate 10. More specifically, at the point depicted in FIG. 2B, an angled halo ion implant process has been performed using a P-type dopant material to form the schematically depicted halo implant regions 221N for the NFET transistor 200N, and another vertical extension ion implant process has been performed using an N-type dopant material to form extension implant regions 223N for the NFET transistor 200N.

Thereafter, in one illustrative embodiment, a very quick anneal process, such as a laser anneal process, may be performed at a temperature of about 1250° C. for about 10 milliseconds or so to repair the damaged lattice structure of the substrate 10 in the areas that were subjected to the ion implant processes discussed above. The implant regions 221P, 223P, 221N, 223N are depicted schematically and they are located in a position where they will be after the anneal process has been performed, where some migration of the implanted dopant material may have occurred.

Figure 2C:
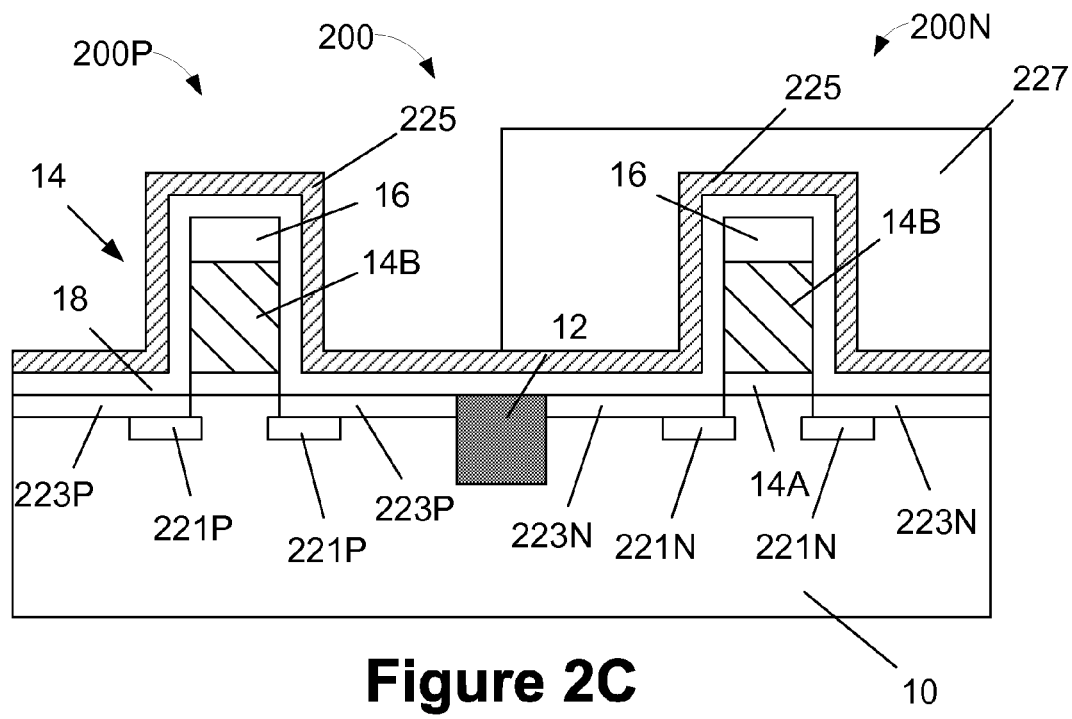

Next, as shown in FIG. 2C, a hard mask layer 225, made of a material such as silicon nitride, is formed above the NFET transistor 200N and the PFET transistor 200P. The hard mask layer 225 may be formed by blanket-depositing the hard mask layer 225 across the device 200 using a CVD process. The thickness of the hard mask layer 225 may vary depending upon the particular application, e.g., 5-8 nm. Thereafter, a masking layer 227, such as a photoresist mask, is formed above the device 200 so as to cover the NFET transistor 200N and expose the PFET transistor 200P for further processing.

Figure 2D:
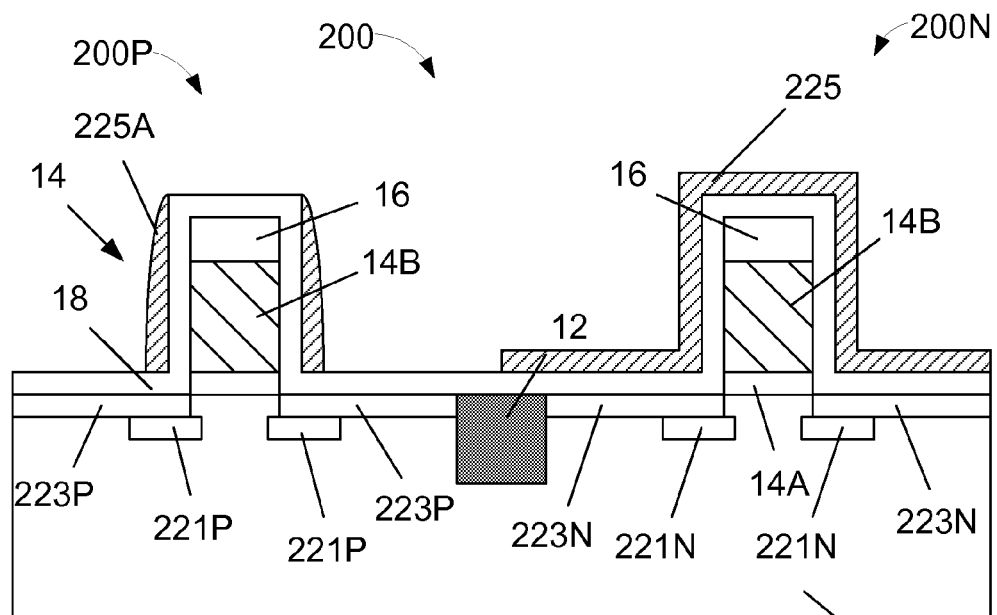

Next, as shown in FIG. 2D, an anisotropic etching process is performed (with the masking layer 227 in place) to remove the exposed portions of the hard mask layer 225 from above the PFET transistor 200P. This process results in the formation of a first sidewall spacer 225A adjacent the PFET transistor 200P. In some embodiments, the first spacer 225A may have a base width of about 4-8 nm. The masking layer 227 is then removed by performing, for example, an ashing process. This results in the structure depicted in FIG. 2D, wherein the hard mask layer 225 remains positioned above the NFET transistor 200N.

Figure 2E:
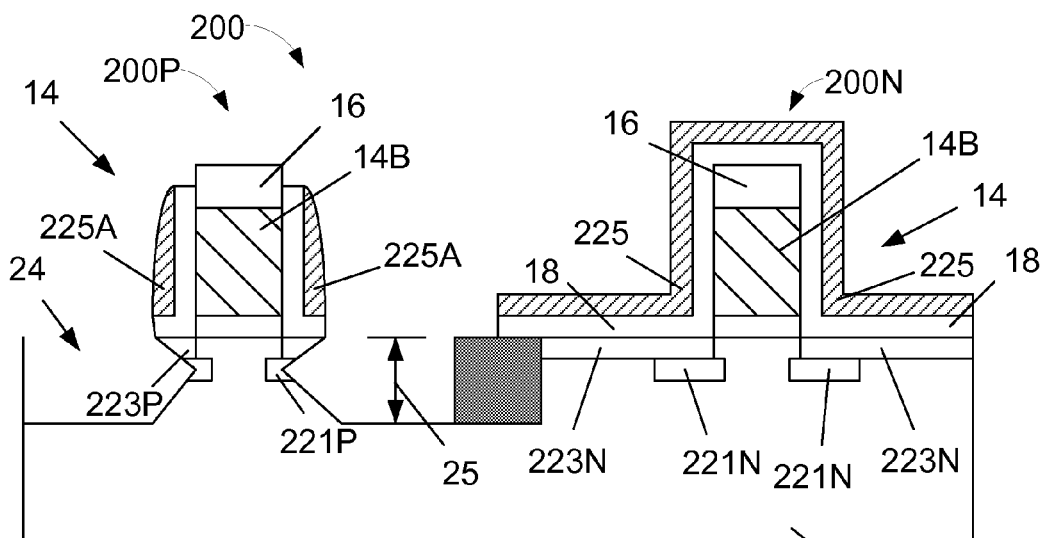

FIG. 2E depicts the device 200 after several process operations have been performed. More specifically, one or more etching processes are performed to remove the exposed portions of the liner layer 18 (e.g., silicon nitride) to thereby expose the surface of the substrate 10 and the gate cap layer 16 on the PFET transistor 200P. Thereafter, one or more etching processes are performed to define cavities 24 in areas of the substrate 10 where source/drain regions for the PFET transistor 200P will ultimately be formed. The depth and shape of the cavities 24 may vary depending upon the particular application as noted previously in connection with the discussion of the prior art device 100. In one example, where the cavities 24 have an overall depth 25 of about 70 nm, the cavities 24 may be formed by performing an initial dry anisotropic etching process to a depth of about 40-50 nm and, thereafter, performing a wet etching process using, for example, TMAH, which has an etch rate that varies based upon the crystalline structure of the substrate 10, e.g., the etching process using TMAH exhibits a higher etch rate in the 110 direction than it does in the 100 direction.

Figure 2F:
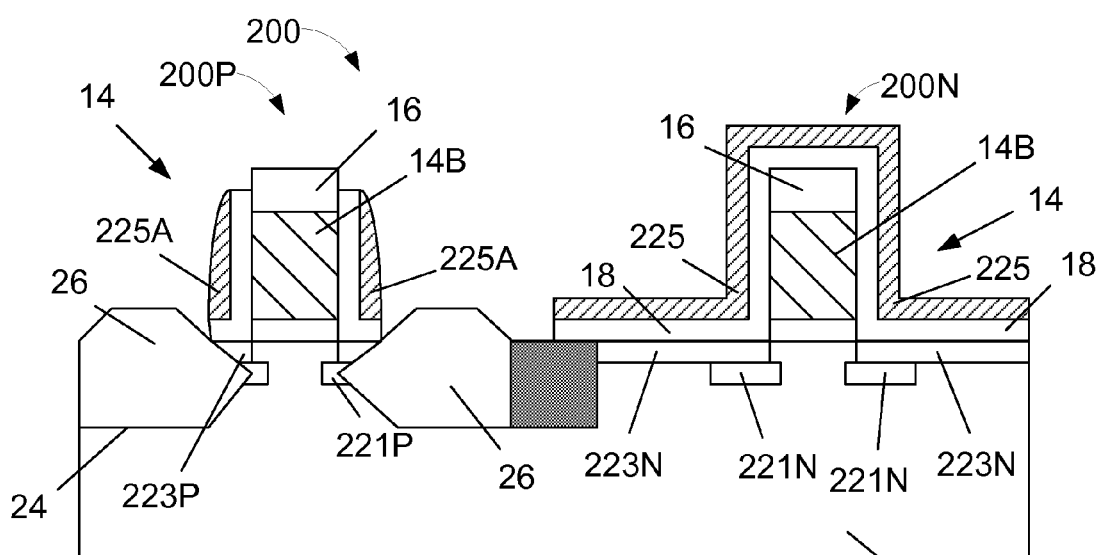

FIG. 2F depicts the device 200 after an epitaxial deposition process has been performed to form epitaxial semiconductor material regions 26, such as silicon/germanium or silicon/carbon, in the cavities 24. In the depicted example, the regions 26 have an overfill portion that extends above the surface of the substrate 10. The epitaxial semiconductor material regions 26 may be formed by performing well-known epitaxial deposition processes.

Figure 2G:
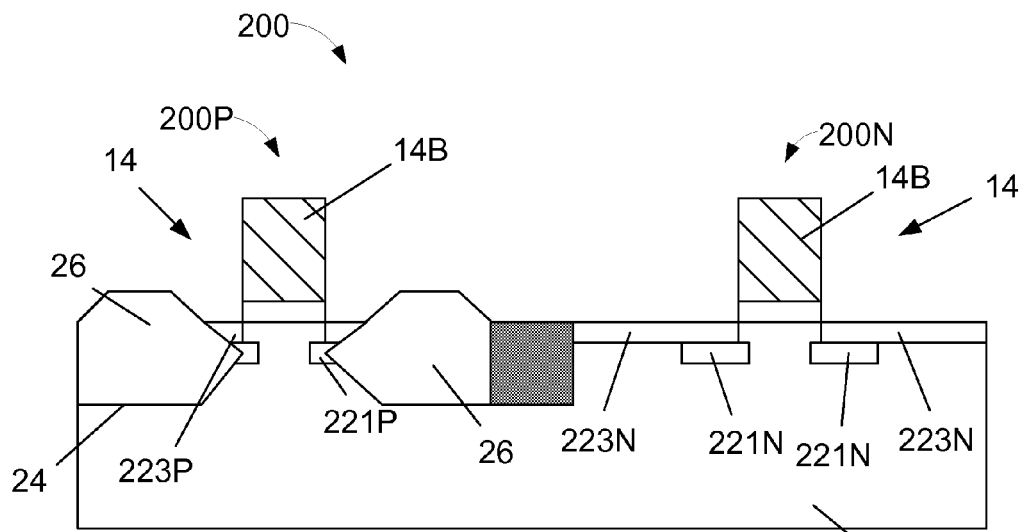

Next, as shown in FIG. 2G, one or more etching processes are performed to remove the silicon nitride materials and exposed portions of the liner layer 18. In one embodiment, a wet etching process that is not highly selective to silicon dioxide and silicon nitride may be performed to remove the various materials, such as the silicon nitride masking layer 225 (above the NFET device 200N), the first sidewall spacers 225A on the PFET device 200P, the exposed portions of the liner layer 18, and the silicon nitride cap layers 16 to thereby result in the structure depicted in FIG. 2G. In another example, a three step etching sequence may be performed to remove silicon nitride—silicon dioxide—silicon nitride materials, e.g., a hot phosphoric acid etch followed by a dilute HF acid etch followed by another hot phosphoric acid etch. Thereafter, if desired or needed, a short dilute HF acid cleaning process can be performed to remove any residual silicon dioxide materials if present, such as the re-oxidation layer 15 depicted in FIG. 2A if such a layer is employed. In one illustrative embodiment, at the end of these various etching processes, the sidewalls of the gate structures may be exposed and the surfaces of the substrate 10 and the semiconductor material 26 are free of any silicon dioxide or silicon nitride material.

Figure 2H:
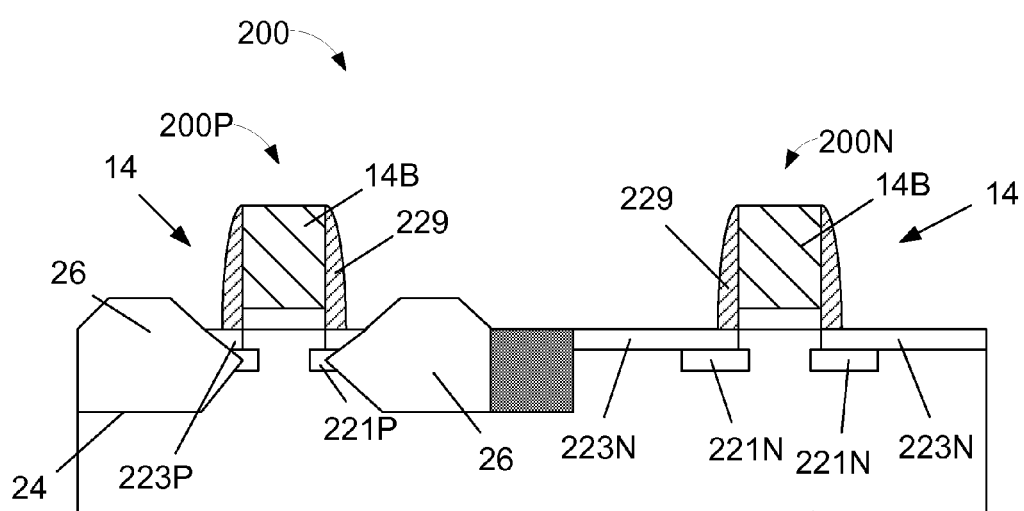

Next, as shown in FIG. 2H, relatively large second sidewall spacers 229 with an illustrative base width of about 15-20 nm are formed adjacent gate structures for both the PFET transistor 200P and the NFET transistor 200N. The second spacers 229 may be comprised of a variety of different materials and may be formed by depositing a layer of spacer material, such as silicon nitride, and thereafter performing an anisotropic etching process.

Figure 2I:
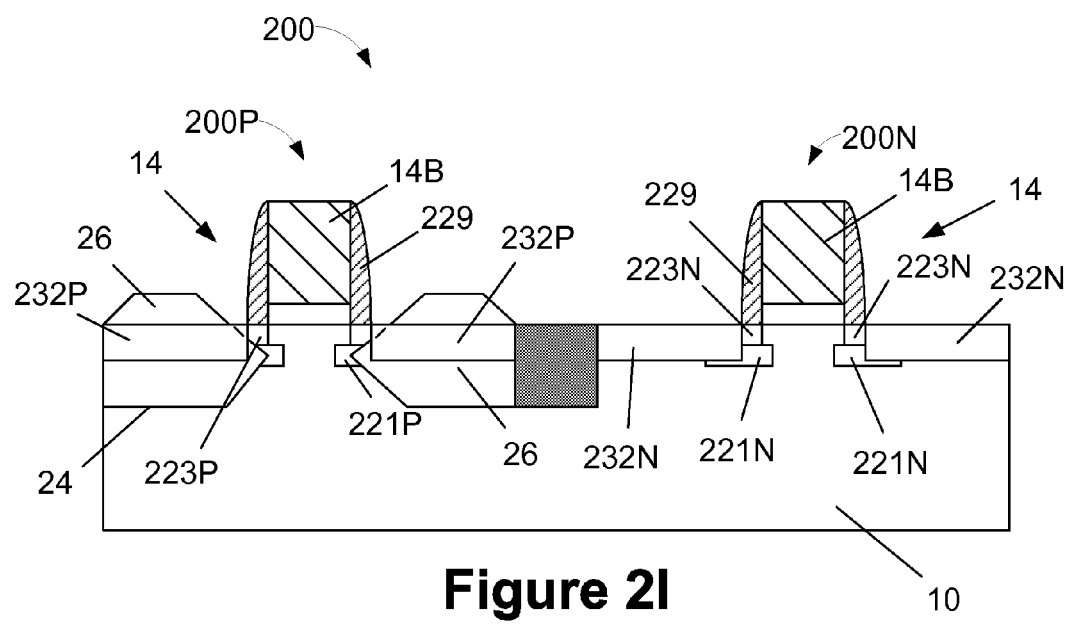

Next, using appropriate masking layers, as shown in FIG. 2I, various deep source/drain ion implantation processes are performed to form deep source/drain implant regions in both the PFET transistor 200P and the NFET transistor 200N with the second sidewall spacers 229 in the indicated positions. The deep source/drain implant regions may be formed first on either of the PFET transistor 200P or the NFET transistor 200N. In one illustrative process flow, a masking layer (not shown), such as a photoresist mask, is formed so as to cover the PFET transistor 200P and expose the NFET transistor 200N for further processing. Then, an ion implantation process is performed to form P-doped deep source/drain implant regions 232P for the PFET transistor 200P. Next, the masking layer (not shown) above the NFET transistor 200N is removed and a masking layer (not shown), such as a photoresist mask, is formed so as to cover the PFET transistor 200P and expose the NFET transistor 200N such that the source/drain doped regions for the NFET transistor 200N may be formed in the substrate 10. More specifically, another vertical ion implant process is performed using an N-type dopant material to form deep source/drain implant regions 232N for the NFET transistor 200N.

Thereafter, in one illustrative embodiment, a very quick anneal process, such as a laser anneal process, may be performed at a temperature of about 1250° C. for about 10 milliseconds or so to repair the damaged lattice structure of the substrate 10 in the areas that were subjected to the ion implant processes discussed above and to activate the implanted dopant materials. The implant regions 232P, 232N are depicted schematically and they are located in a position where they will be after the anneal process has been performed, wherein some migration of the implanted dopant material may have occurred. At this point in fabrication, traditional manufacturing operations may be performed to complete the fabrication of the device 200. For example, metal silicide regions (not shown) may be formed on the exposed gate electrode layers 14B and the source/drain regions that are formed in the substrate 10. The metal silicide regions may be made of any metal silicide and they may be formed using traditional silicidation techniques. The typical steps performed to form metal silicide regions are: (1) depositing a layer of refractory metal; (2) performing an initial heating process causing the refractory metal to react with underlying silicon-containing material; (3) performing an etching process to remove unreacted portions of the layer of refractory metal; and (4) performing an additional heating process to form the final phase of the metal silicide. The details of such silicidation processes are well known to those skilled in the art. The metal silicide regions need not be the same metal silicide material on both the PFET transistor 200P and the NFET transistor 200N, although that may be the case in some embodiments. Although not depicted in the drawings, the fabrication of the device 200 would also include several additional steps, such as the formation of a plurality of conductive contacts or plugs in a layer of insulating material so as to establish electrical connection with the source/drain regions of the transistors.

It should be noted that, when it is stated in this detailed description or in the claims, that certain spacers or combinations of spacers are positioned "proximate" to a structure or component, such as a gate structure, such language will be understood to cover situations where such a spacer or combinations of spacers actually contacts the structure or component, as well as a situation where there are one or more intervening layers of material between the spacer and the structure or component. For example, in some cases, there may be a liner layer or other spacers positioned between the referenced spacer and referenced structure, such as the illustrative gate structures 14 depicted herein. Additionally, the fact that the claims may make shorthand reference to a "first" spacer or a "first" type of process, such language does not mean that such a spacer or process was literally the first such spacer or process that was made or performed on the device 200.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method that includes the formation of a first sidewall spacer only proximate a gate structure of a first transistor and while not forming said first sidewall spacer proximate a gate structure of a second transistor, the method comprising:

forming said gate structure for said first transistor and said gate structure for said second transistor above first and second active regions, respectively, of a semiconducting substrate;

forming a liner layer above said gate structures for said first and second transistors and said semiconducting substrate;

before forming said first sidewall spacer proximate only said gate structure of said first transistor, performing a plurality of extension ion implant processes through said liner layer to form extension implant regions in said substrate for said first transistor and said second transistor;

after forming the extension implant regions in the substrate for the first and second transistors, forming said first sidewall spacer proximate only said gate structure for said first transistor while not forming said first sidewall spacer proximate said gate structure of said second transistor and a patterned hard mask layer that covers said gate structure and said second active region in said substrate for said second transistor;

with said first sidewall spacer in position proximate only said gate structure of said first transistor, forming a plurality of cavities in said semiconducting substrate proximate said gate structure of said first transistor and forming a semiconductor material in said cavities;

after forming said semiconductor material in said cavities proximate said gate structure of said first transistor, performing at least one etching process to remove at least said first sidewall spacer positioned adjacent only said gate structure for said first transistor, said patterned hard mask layer positioned above said second transistor and said liner layer so as to thereby expose sidewalls of the gate structures for both said first and second transistors and expose upper surfaces of said first and second active regions;

after performing said at least one etching process, forming a second sidewall spacer proximate both said gate structure for said first transistor and said gate structure for said second transistor; and with said second sidewall spacers in position, performing a plurality of source/drain ion implant processes to form deep source/drain implant regions in said substrate for said first transistor and said second transistor.

2. The method of claim 1, wherein said first transistor is a PFET transistor and said second transistor is an NFET transistor.

3. The method of claim 1, wherein said first transistor is an NFET transistor and said second transistor is a PFET transistor.

4. The method of claim 1, further comprising performing at least one heating process to activate dopants implanted during said extension ion implant processes and to activate dopants implanted during said source/drain ion implant processes.

5. The method of claim 1, wherein said first and second sidewall spacers are comprised of silicon nitride and said liner layer is comprised of silicon dioxide.

6. The method of claim 1, further comprising, before forming said first sidewall spacer, performing a plurality of halo ion implant processes through said liner layer to form halo implant regions in said substrate for said first transistor and said second transistor.

7. The method of claim 6, wherein, for each of said first transistor and said second transistor, said halo ion implant processes are performed prior to performing said extension ion implant processes.

8. The method of claim 6, wherein, for each of said first transistor and said second transistor, said halo ion implant processes are performed after performing said extension ion implant processes.

9. The method of claim 1, wherein forming said semiconductor material in said cavities comprises performing an epitaxial deposition process to form a silicon/germanium material or a silicon/carbon material proximate in said cavities.

10. The method of claim 1, wherein said first sidewall spacers have a base width that is less than a base width of said second sidewall spacers.

11. A method that includes the formation of a first sidewall spacer proximate only a gate structure of a PFET transistor while not forming said first sidewall spacer proximate a gate structure of an NFET transistor, the method comprising:

forming said gate structure for said PFET transistor and said gate structure for said NFET transistor above first and second active regions, respectively, of a semiconducting substrate;

forming a liner layer above said gate structures and said semiconducting substrate;

before forming said first sidewall spacer proximate only said gate structure of said PFET transistor, performing a plurality of extension ion implant processes through said liner layer to form extension implant regions in said substrate for said PFET transistor and said NFET transistor;

after forming the extension implant regions in the substrate for said PFET and NFET transistors, forming said first sidewall spacer proximate only said gate structure for said PFET transistor while not forming said first sidewall spacer proximate said gate structure of said NFET transistor and a patterned hard mask layer that covers said gate structure and said second active region in said substrate for said NFET transistor, wherein said first sidewall spacer has a base width;

with said first sidewall spacer in position proximate only said gate structure of said PFET transistor, forming a plurality of cavities in said semiconducting substrate proximate said gate structure of said PFET transistor;

performing an epitaxial deposition process to form a silicon/germanium material or a silicon/carbon material in said cavities proximate said gate structure of said PFET transistor;

after forming the extension implant regions in the substrate for said PFET and NFET transistors and after performing said epitaxial deposition process, performing at least one etching process to remove at least said first sidewall spacers positioned adjacent only said gate structure for said PFET transistor, said patterned hard mask layer positioned above said NFET transistor and said liner layer so as to thereby expose sidewalls of the gate structures for both said PFET and NFET transistors and expose upper surfaces of said first and second active regions;

after performing said at least one etching process, forming a second sidewall spacer proximate both said gate structure for said PFET transistor and said gate structure for said NFET transistor, wherein said second sidewall spacer has a base width that is greater than said base width of said first sidewall spacer; and with said second sidewall spacers in position, performing a plurality of source/drain ion implant processes to form deep source/drain implant regions in said substrate for said PFET transistor and said NFET transistor.

12. The method of claim 11, further comprising performing at least one heating process to activate dopants implanted during said extension ion implant processes and to activate dopants implanted during said source/drain ion implant processes.

13. The method of claim 11, wherein said first and second sidewall spacers are comprised of silicon nitride and said liner layer is comprised of silicon dioxide.

14. The method of claim 11, wherein, prior to forming said first sidewall spacer, the method further comprises performing a plurality of halo implant regions in said substrate for said PFET transistor and said NFET transistor.

15. The method of claim 14, wherein, for each of said PFET transistor and said NFET transistor, said halo implant regions are formed prior to said extension implant regions.

16. The method of claim 14, wherein, for each of said PFET transistor and said NFET transistor, said halo implant regions are formed after said extension implant regions.

17. A method that includes the formation of a first sidewall spacer proximate only a gate structure of a PFET transistor while not forming said first sidewall spacer proximate a gate structure of an NFET transistor, the method, comprising:

forming said gate structure for said PFET transistor and said gate structure for said NFET transistor above first and second active regions, respectively, of a semiconducting substrate;

forming a liner layer above said gate structures and said semiconducting substrate;

before forming said first sidewall spacer proximate only said gate structure of said PFET transistor, performing a plurality of extension ion implant processes through said liner layer to form extension implant regions in said substrate for said PFET transistor and said NFET transistor;

after forming the extension implant regions in the substrate for said PFET and NFET transistors, forming a hard mask layer above said PFET transistor and said NFET transistor;

forming an etch mask above said hard mask layer above said NFET transistor, wherein said etch mask covers said gate structure and said second active region in said substrate for said NFET transistor and exposes said hard mask layer above said PFET transistor for further processing;

performing an anisotropic etching process through said etch mask on said hard mask layer to thereby form said first sidewall spacer proximate only said gate structure for said PFET transistor while not forming said first sidewall spacer proximate said gate structure of said NFET transistor;

performing at least one first etching process with said first sidewall spacer in place proximate only said gate structure for said PFET transistor to define a plurality of cavities in said substrate proximate said gate structure for said PFET transistor;

performing an epitaxial deposition process to form a silicon/germanium material or a silicon/carbon material in said cavities;

after forming the extension implant regions in the substrate for said PFET and NFET transistors and after performing said epitaxial deposition process, performing at least one second etching process to remove at least said first sidewall spacer positioned adjacent only said gate structure for said PFET transistor, said patterned hard mask layer positioned above said NFET transistor and said liner layer so as to thereby expose sidewalls of the gate structures for both said PFET and NFET transistors and expose upper surfaces of said first and second active regions;

after performing said at least one second etching process, forming a second sidewall spacer proximate both said gate structure for said PFET transistor and said gate structure for said NFET transistor; and with said second sidewall spacers in position, performing a plurality of source/drain ion implant processes to form deep source/drain implant regions in said substrate for said PFET transistor and said NFET transistor.

18. The method of claim 17, wherein, prior to forming said hard mask layer, the method further comprises performing a plurality of halo implant regions in said substrate for said PFET transistor and said NFET transistor.

19. The method of claim 18, wherein, for each of said PFET transistor and said NFET transistor, said halo implant regions are formed prior to said extension implant regions.

20. The method of claim 18, wherein, for each of said PFET transistor and said NFET transistor, said halo implant regions are formed after said extension implant regions.

21. The method of claim 17, wherein said first sidewall spacer has a base width that is less than a base width of said second sidewall spacers.

* * * * *